United States Patent
Utsumi et al.

(10) Patent No.: US 10,263,082 B2
(45) Date of Patent: Apr. 16, 2019

(54) SEMICONDUCTOR DEVICE HAVING A GATE ELECTRODE FORMED INSIDE A TRENCH

(71) Applicant: Fuji Electric Co., Ltd., Kanagawa (JP)

(72) Inventors: Makoto Utsumi, Ibaraki (JP); Akimasa Kinoshita, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 15/722,934

(22) Filed: Oct. 2, 2017

(65) Prior Publication Data

US 2018/0097069 A1    Apr. 5, 2018

(30) Foreign Application Priority Data

Oct. 5, 2016 (JP) .................. 2016-197609

(51) Int. Cl.

| | |
|---|---|
| *H01L 29/16* | (2006.01) |
| *H01L 29/10* | (2006.01) |
| *H01L 29/66* | (2006.01) |
| *H01L 29/78* | (2006.01) |
| *H01L 29/423* | (2006.01) |

(Continued)

(52) U.S. Cl.
CPC ...... *H01L 29/1608* (2013.01); *H01L 29/0623* (2013.01); *H01L 29/1095* (2013.01); *H01L 29/42376* (2013.01); *H01L 29/66068* (2013.01); *H01L 29/7813* (2013.01); *H01L 29/086* (2013.01); *H01L 29/0878* (2013.01)

(58) Field of Classification Search
CPC ............. H01L 29/1608; H01L 29/7813; H01L 29/1095; H01L 29/0878; H01L 29/086; H01L 29/7397; H01L 29/7802; H01L 29/4236; H01L 29/66712; H01L 29/7827
See application file for complete search history.

(56) References Cited

U.S. PATENT DOCUMENTS

| 5,744,826 A | 4/1998 | Takeuchi et al. |
| 5,915,180 A | 6/1999 | Hara et al. |

(Continued)

FOREIGN PATENT DOCUMENTS

| JP | 3471473 B2 | 12/2003 |
| JP | 3471509 B2 | 12/2003 |

(Continued)

*Primary Examiner* — Khiem D Nguyen
(74) *Attorney, Agent, or Firm* — Chen Yoshimura LLP

(57) ABSTRACT

A gate trench of a MOS gate formed in the front surface of a silicon carbide substrate includes a first portion that includes the bottom surface of the gate trench, a second portion that is connected to the substrate front surface side of the first portion, and a third portion that is connected to the substrate front surface side of the second portion. In the third portion of the gate trench, an $n^+$ source region is exposed along the sidewalls. The width of the third portion of the gate trench is greater than the widths of the first and second portions and of the gate trench. Upper corners of the gate trench smoothly connect the sidewalls to the substrate front surface. The thickness of a gate insulating film smoothly connected along the bottom surface and sidewalls of the gate trench is substantially uniform over the entire inner wall surface of the gate trench.

15 Claims, 9 Drawing Sheets

(51) Int. Cl.
*H01L 29/06* (2006.01)
*H01L 29/08* (2006.01)

(56) References Cited

U.S. PATENT DOCUMENTS

| | | | | |
|---|---|---|---|---|
| 8,084,812 | B2 * | 12/2011 | Kitamura | H01L 29/66666 |
| | | | | 257/329 |
| 8,253,222 | B2 * | 8/2012 | Momota | H01L 29/41766 |
| | | | | 257/621 |
| 8,735,906 | B2 | 5/2014 | Nakano | |
| 9,130,036 | B2 | 9/2015 | Kiyosawa et al. | |
| 2012/0061682 | A1 * | 3/2012 | Yamamoto | H01L 29/086 |
| | | | | 257/77 |
| 2013/0181282 | A1 * | 7/2013 | Yilmaz | H01L 29/66727 |
| | | | | 257/330 |
| 2014/0235058 | A1 * | 8/2014 | Mauder | H01L 29/408 |
| | | | | 438/702 |
| 2014/0264564 | A1 * | 9/2014 | Cheng | H01L 29/7827 |
| | | | | 257/330 |

FOREIGN PATENT DOCUMENTS

| | | |
|---|---|---|
| JP | 5649152 B1 | 1/2015 |
| JP | 2015-135862 A | 7/2015 |
| WO | 2010/119789 A1 | 10/2010 |

\* cited by examiner

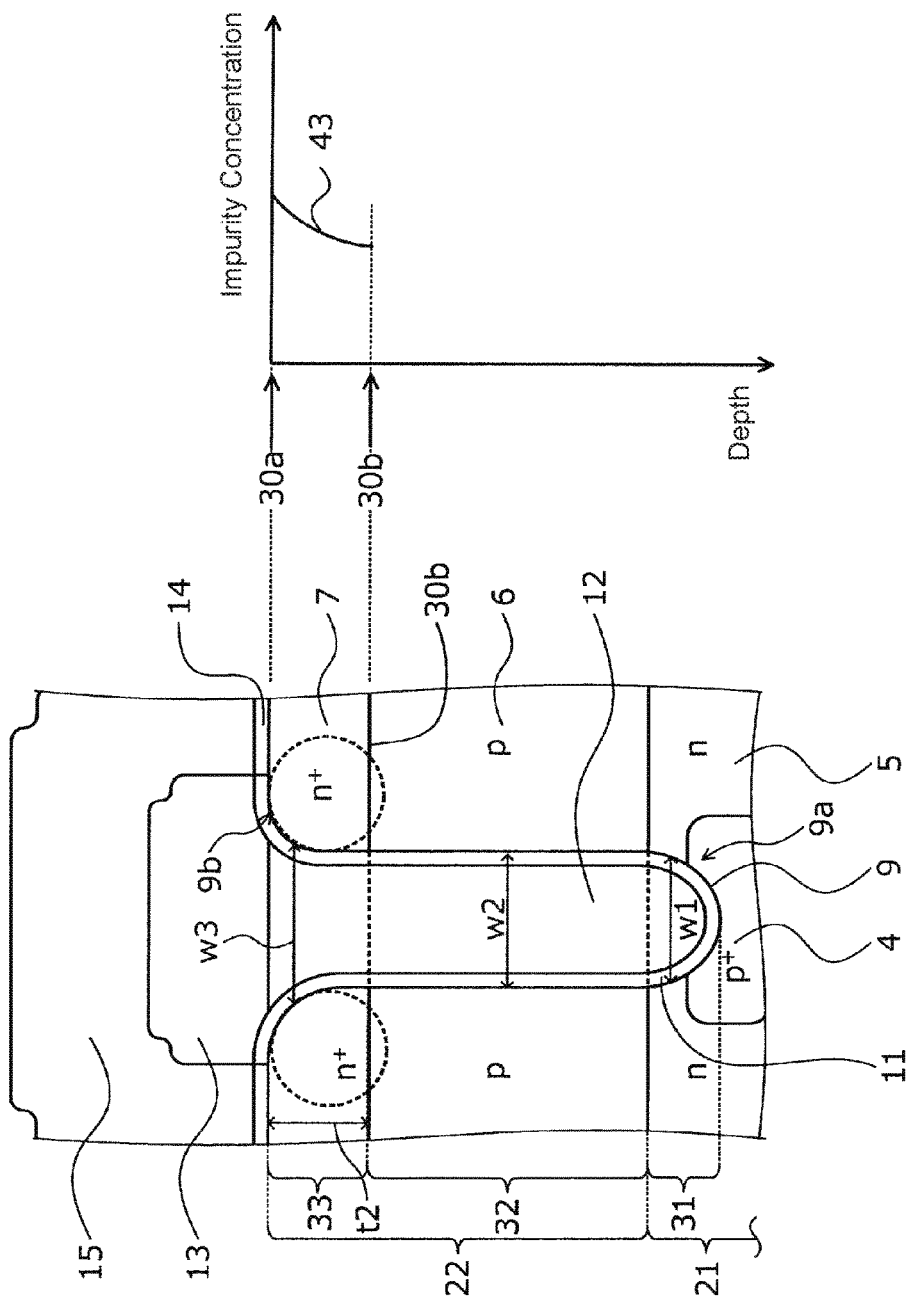

| | Average Voltage Yielding $1 \times 10^{-8}$ A | Average Current at 8 MV/cm | Number of Devices Damaged at 8 MV/cm |
|---|---|---|---|
| Working Example 1 | 43 V | $6 \times 10^{-3}$ A | 4 |
| Working Example 2 | 48 V | $5 \times 10^{-3}$ A | 3 |
| Working Example 3 | 52 V | $5 \times 10^{-3}$ A | 3 |
| Comparison Example | 18 V | $1.2 \times 10^{-2}$ A | 72 |

SEMICONDUCTOR DEVICE HAVING A GATE ELECTRODE FORMED INSIDE A TRENCH

BACKGROUND OF THE INVENTION

Technical Field

The present invention relates to a semiconductor device and a method of manufacturing the semiconductor device.

Background Art

In the field of vertical metal-oxide-semiconductor field effect transistors (MOSFETs), two conventionally well-known MOS gate structures are the planar gate structure (in which a planar MOS gate is formed on a semiconductor substrate) and the trench gate structure (in which a MOS gate is buried within a trench formed in a semiconductor substrate).

In the trench gate structure, the channel is formed orthogonal to the substrate front surface, thereby making it possible to reduce the cell width to a greater extent than in the planar gate structure (in which the channel is formed parallel to the substrate front surface), which in turn makes it possible to increase the cell density per unit area. Therefore, MOSFETs typically utilize the trench gate structure to make it possible to increase the current density per unit area as well as to make it easier to satisfy the requirements associated with increasingly high currents.

Silicon carbide (SiC) exhibits various advantageous physical properties in comparison with silicon (Si), such as a bandgap that is approximately three times greater, a dielectric breakdown field strength that is nearly an order of magnitude greater, and a high saturated drift velocity for electrons. Therefore, use of semiconductors such as silicon carbide that have a wider bandgap than silicon (hereinafter, "wide-bandgap semiconductors") is effective in production (manufacture) of semiconductor devices having greater performance than silicon semiconductor devices.

One previously proposed method of manufacturing a silicon carbide trench-gate MOSFET includes a process for growing an epitaxial layer of silicon carbide (hereinafter, a "silicon carbide epitaxial layer"), an ion implantation process for forming prescribed regions of a MOS gate, and a dry etching process for forming a trench for the MOS gate (hereinafter, a "gate trench"), which are performed in that order (see Patent Document 1, for example).

In Patent Document 1, an n⁻ silicon carbide epitaxial layer (an n⁻ drift region) and a p-type silicon carbide epitaxial layer (a p-type base region) are deposited in that order, and then an n⁺ source region is selectively formed in the p-type silicon carbide epitaxial layer using ion implantation. The channel length is determined by the thickness of the p-type silicon carbide epitaxial layer, where the thickness of the p-type silicon carbide epitaxial layer is set in the range of approximately 1.0 μm to 2.0 μm.

Furthermore, in semiconductor devices that use a wide-bandgap semiconductor such as silicon carbide, there is demand for device structures that offer both higher withstand voltages and higher switching speeds than silicon semiconductor devices. Vertical trench-gate MOSFETs, for example, exhibit a large voltage difference between the gate electrode and the drain electrode when switched OFF. It is well known that because of this, the electric field concentrates particularly strongly on the bottom surface of the gate trench, which makes the gate insulating film on the bottom surface of the gate trench prone to dielectric breakdown.

Examples of previously proposed semiconductor devices that use silicon carbide (hereinafter, "silicon carbide semiconductor devices") and reduce dielectric breakdown of the gate insulating film on the bottom surface of the gate trench include devices in which the thickness of the gate insulating film is set to be greater at the portion on the bottom surface of the gate trench than at the portions on the sidewalls (see Patent Document 2 (paragraph [0006] and FIG. 1) and Patent Document 3 (paragraph [0040] and FIG. 3), for example).

In Patent Document 2, taking advantage of the fact that the oxidation speed of the (000-1) plane (the so-called c-plane) of silicon carbide is approximately five times greater than the oxidation speed of crystal planes orthogonal to the c-plane, the bottom surface of the gate trench is set to be a c-plane, and the gate insulating film is formed using thermal oxidation. In Patent Document 3, the gate trench has a cross-sectional shape in which the bottom surface that is parallel to the substrate front surface and the sidewalls that are orthogonal to the substrate front surface are connected together by slanted portions of a prescribed inclination relative to the substrate front surface.

In another proposed silicon carbide semiconductor device, the corner portions at the upper corners and bottom surface corners of the gate trench are partially removed via thermal etching to change the inclination of the sidewalls of the gate trench relative to the substrate front surface in a three-tiered manner moving from the bottom surface side to the substrate front surface side (see Patent Document 4 (paragraphs [0041] to [0042] and FIG. 3), for example). In Patent Document 4, there is a reduction in thermal strain to which the upper corners and bottom surface corners of the gate trench are subjected during operation of the MOSFET due to differences in coefficient of thermal expansion between the silicon carbide, the gate insulating film, and the gate electrode, thereby improving the reliability of the MOSFET.

In yet another previously proposed silicon carbide semiconductor device, an annealing process is performed in an inert gas to induce surface diffusion in the silicon carbide and curve the upper corners and bottom surface corners of the gate trench into arc shapes (see Patent Document 5 (paragraph [0111] and FIGS. 1 and 6), for example). In Patent Document 5, shifts in the surface orientation of the sidewalls of the gate trench are reduced, thereby improving the channel mobility of carriers. Note that here, "upper corners of the gate trench" refers to the intersections between the substrate front surface and the sidewalls of the gate trench. Similarly, "bottom surface corners of the gate trench" refers to the corners at the intersections between the sidewalls and bottom surface of the gate trench.

RELATED ART DOCUMENTS

Patent Documents

Patent Document 1: Japanese Patent No. 3471473
Patent Document 2: Japanese Patent No. 3471509
Patent Document 3: WO 2010/119789
Patent Document 4: Japanese Patent Application Laid-Open Publication No. 2015-135862
Patent Document 5: Japanese Patent No. 5649152

SUMMARY OF THE INVENTION

However, in Patent Document 1, although taking advantage of the crystal plane-dependent differences in the oxidation speed of silicon carbide makes it possible to easily form a gate insulating film (oxide film) having large thickness at the portion on the bottom surface of the gate trench, the usable surface orientations are limited. Moreover, because the same crystal plane as that at the bottom surface of the gate trench is exposed on the front surface of the silicon carbide substrate (a semiconductor substrate made of silicon carbide), an oxide film of the same thickness as that on the bottom surface of the gate trench also grows on the front surface of the silicon carbide substrate. Therefore, source regions and the like that are formed in the surface layer of the front surface of the silicon carbide substrate can potentially be eroded and lost due to the growth of the oxide film on the front surface of the silicon carbide substrate.

Furthermore, the reliability of gate insulating films is typically evaluated by performing reliability tests in which the current that flows when a high electric field is applied to the gate insulating film (the Fowler-Nordheim tunneling current) is calculated to evaluate the time-dependent dielectric breakdown (TDDB) of the gate insulating film. Fowler-Nordheim tunneling current refers to the leakage current that flows due to electrons tunneling from the conduction band of the semiconductor to the conduction band of the oxide film when a high electric field is applied to the oxide film. Reducing this leakage current requires reducing local concentration of the electric field on the gate trench.

The present invention was made to solve such problems in the conventional technologies described above and aims to provide a semiconductor device and a method of manufacturing the semiconductor device that make it possible to improve the reliability of the gate insulating film. Accordingly, the present invention is directed to a scheme that substantially obviates one or more of the problems due to limitations and disadvantages of the related art.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: a semiconductor substrate made of a semiconductor having a wider bandgap than silicon; a first semiconductor layer of a first conductivity type made of a semiconductor having a wider bandgap than silicon and formed on a front surface of the semiconductor substrate; a second semiconductor layer of a second conductivity type made of a semiconductor having a wider bandgap than silicon and formed on a surface of the first semiconductor layer on a side opposite to the semiconductor substrate; a first semiconductor region of the second conductivity type selectively formed within the first semiconductor layer and contacting the second semiconductor layer; a second semiconductor region of the second conductivity type selectively formed within the first semiconductor layer and separated from the second semiconductor layer and the first semiconductor region; a third semiconductor region of the first conductivity type selectively formed within the second semiconductor layer adjacent to or in a top surface of the second semiconductor layer; a trench going through the third semiconductor region and the second semiconductor layer and reaching the first semiconductor layer, at least a bottom of the trench being in contact with the second semiconductor region in the first semiconductor layer; a gate insulating film formed along an inner wall of the trench and having a uniform thickness over an entire surface of the inner wall of the trench; a gate electrode formed inside the trench on the gate insulating film; a first electrode that is electrically connected to the third semiconductor region and the second semiconductor layer; and a second electrode that is electrically connected to a rear surface of the semiconductor substrate, wherein the trench has: a first portion surrounded by and in contact with the first semiconductor layer; a second portion connected to the first portion, surrounded by and in contact with a portion of the second semiconductor layer other than the third semiconductor region; and a third portion connected to the second portion, surrounded by and in contact with the third semiconductor region, the third portion being wider than the first portion, wherein a depth profile of an impurity concentration in the third semiconductor region is gradually decreasing from a top towards a bottom, or is substantially constant in the third semiconductor region and has a tail portion that extends downwardly from a boundary between the third semiconductor region and said portion of the second semiconductor layer, and wherein sidewalls of the first and second portions of the trench are shaped to generally correspond to said depth profile of the impurity concentration.

Furthermore, in the semiconductor device according to one aspect of the present invention as described above, an impurity concentration of the second semiconductor layer may be less than the impurity concentration of the third semiconductor region.

In addition, in the semiconductor device according to one aspect of the present invention as described above, in the trench, a stepped portion that is continuous with a sidewall of the third portion but has a different inclination than the sidewall of the third portion may be formed in the sidewall of the second portion, and a width of the second portion of the trench at the stepped portion may decrease going from the third portion towards the second electrode.

Moreover, in the semiconductor device according to one aspect of the present invention as described above, a width of the third portion of the trench may increase going from the second electrode towards the first electrode.

Furthermore, in the semiconductor device according to one aspect of the present invention as described above, a sidewall of the third portion of the trench may have an arc shape that curves in a convex manner towards an interior of the trench with a radius of curvature of less than a thickness of the third semiconductor region.

In addition, the semiconductor device according to one aspect of the present invention as described above may further include an interlayer insulating film electrically insulating the gate electrode from the first electrode, where the gate insulating film may extend onto a surface of the second semiconductor layer on a side opposite to the first semiconductor layer, the interlayer insulating film may cover the gate insulating film and the gate electrode, and an interface between the interlayer insulating film and the gate electrode may be positioned closer towards the second electrode than an interface between the interlayer insulating film and the gate insulating film.

Moreover, in the semiconductor device according to one aspect of the present invention as described above, the semiconductor having a wider bandgap than silicon may be silicon carbide.

Furthermore, in another aspect, the present disclosure provides a method of manufacturing a semiconductor device, including: a first step of depositing a first epitaxial layer of a first conductivity type on a front surface of a semiconductor substrate made of a semiconductor having a wider bandgap than silicon; a second step of selectively forming a first semiconductor region of a second conductivity type in a surface layer of the first epitaxial layer; a third step of selectively forming a second semiconductor region of the second conductivity type within the first epitaxial layer; a fourth step of, after the second step and the third step, depositing a second epitaxial layer of the second conductivity type on the first epitaxial layer; a fifth step of selectively forming, within the second epitaxial layer, a third semiconductor region of the first conductivity type having a greater impurity concentration than the first epitaxial layer and the second epitaxial layer; a sixth step of forming a trench going through the third semiconductor region and the second epitaxial layer and reaching the first epitaxial layer, at least a bottom of the trench being in contact with the second semiconductor region in the first epitaxial layer; a seventh step of etching a sidewall of the trench by performing a heat treatment in an atmosphere containing hydrogen and silane; an eighth step of forming a gate insulating film along an inner wall of the trench; a ninth step of forming a gate electrode on the gate insulating film inside the trench; a tenth step of forming a first electrode that is electrically connected to the third semiconductor region and the second epitaxial layer; and an eleventh step of forming a second electrode that is electrically connected to a rear surface of the semiconductor substrate.

Moreover, in the method of manufacturing the semiconductor device according to one aspect of the present invention as described above, in the fifth step, the third semiconductor region may be formed such that the impurity concentration thereof decreases going deeper in a thickness direction from a surface of the second epitaxial layer.

Furthermore, in the method of manufacturing the semiconductor device according to one aspect of the present invention as described above, in the sixth step, the trench may be formed using anisotropic etching.

In addition, the method of manufacturing the semiconductor device according to one aspect of the present invention as described above may further include, after the seventh step but before the eighth step, a step that is a group of steps including a twelfth step of forming a sacrificial oxide film by oxidizing the inner wall of the trench and a thirteenth step of removing the sacrificial oxide film formed in the twelfth step to adjust a shape of a sidewall of the trench is performed one or more times.

Moreover, in the method of manufacturing the semiconductor device according to one aspect of the present invention as described above, in the eighth step, the gate insulating film may be deposited on the inner wall of the trench.

In addition, in the method of manufacturing the semiconductor device according to one aspect of the present invention as described above, the semiconductor having a wider bandgap than silicon may be silicon carbide.

The invention as described above makes it possible to inhibit local concentration of the electric field on the gate insulating film, thereby making it possible to increase the dielectric breakdown field strength of the gate insulating film.

The semiconductor device and the method of manufacturing the semiconductor device according to the present invention make it possible to improve the reliability of the gate insulating film. It is to be understood that both the foregoing general description and the following detailed description are exemplary and explanatory, and are intended to provide further explanation of the invention as claimed.

BRIEF DESCRIPTION OF THE DRAWINGS

FIGS. 4A and 4B are a cross-sectional view illustrating an example of another cross-sectional shape for the gate trenches illustrated in FIG. 1 and an impurity concentration profile thereof, respectively.

DETAILED DESCRIPTION OF EMBODIMENTS

Figure 1:
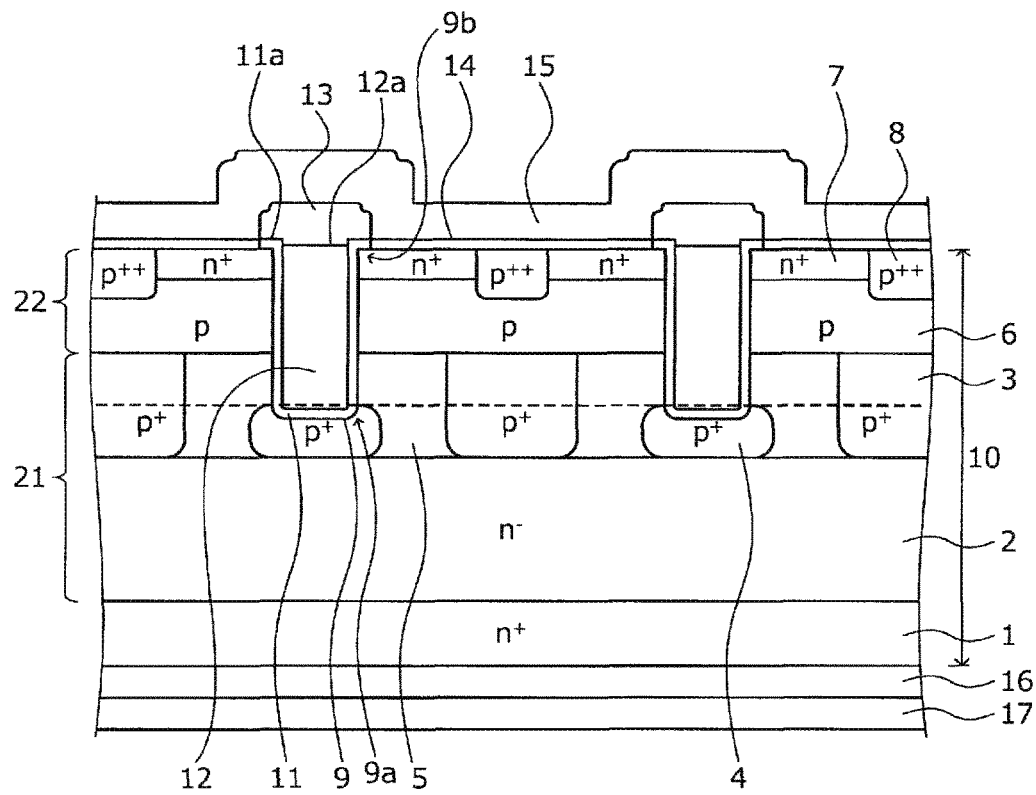
FIG. 1 is a cross-sectional view illustrating the structure of a semiconductor device according to an embodiment.

Preferred embodiments of a semiconductor device and a method of manufacturing the semiconductor device according to the present invention will be described in detail below with reference to the attached drawings. In the present specification and the attached drawings, the letters "n" and "p" are used to indicate whether the majority carriers in a layer or region are electrons or holes, respectively. Moreover, the symbols + and − are appended to the letters n and p to indicate layers or regions having a higher or lower impurity concentration, respectively, than layers or regions in which the + and − symbols are not appended. In the descriptions of the embodiments and the attached drawings, the same reference characters are used to indicate components that are the same, and redundant descriptions of the same components are omitted. Furthermore, the following notation is used for Miller indices in the present specification: the symbol − indicates a bar to be applied to the immediately following index that follows the − symbol; that is, the symbol − is inserted before an index to indicate that that index is negative.

Embodiment

Figures 2A, 2B:
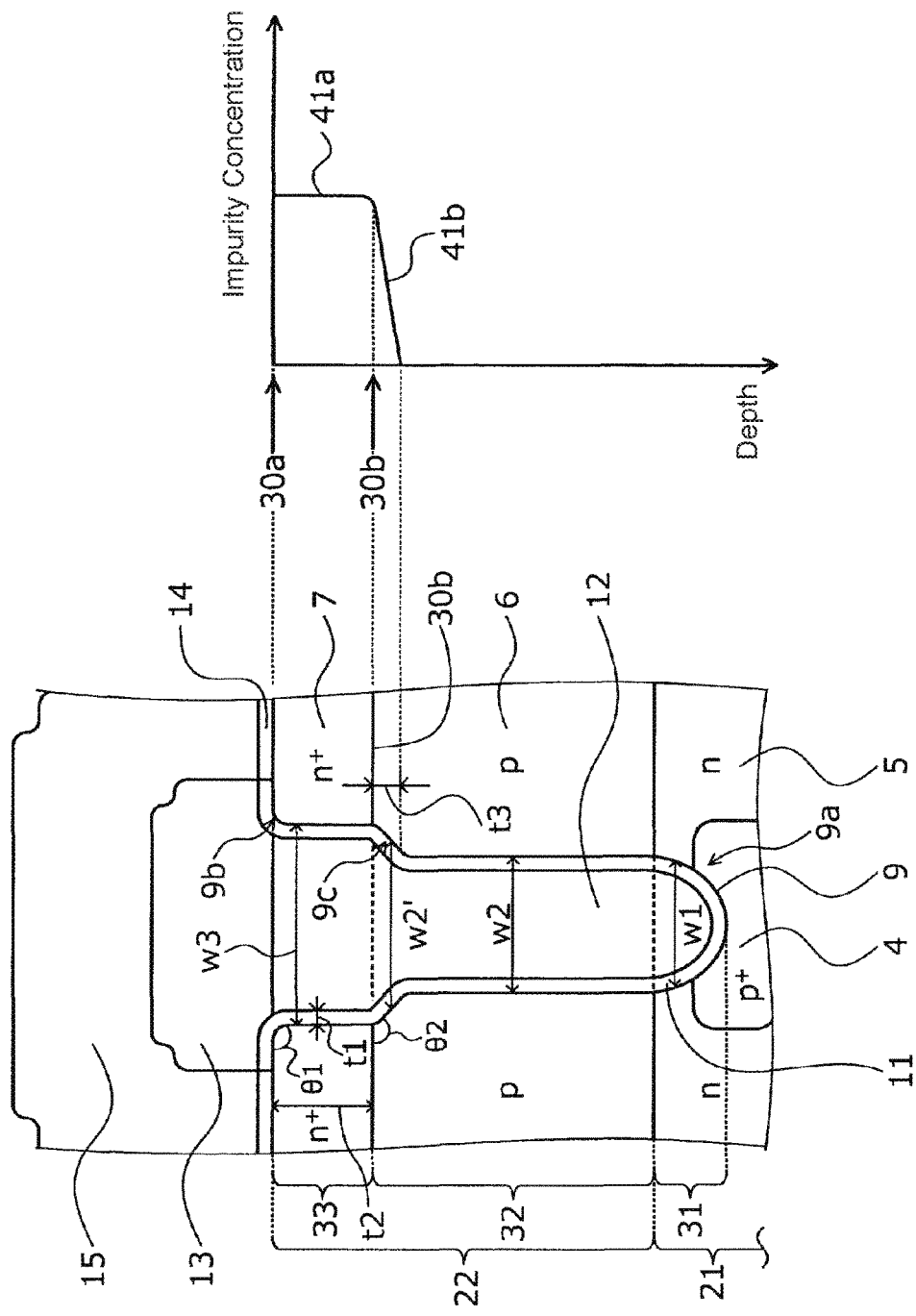
FIGS. 2A and 2B are an enlarged cross-sectional view illustrating a cross-sectional shape for the gate trenches illustrated in FIG. 1 and an impurity concentration profile thereof, respectively.

A semiconductor device according to the present invention is made using a semiconductor that has a wider bandgap than silicon (hereinafter, a "wide-bandgap semiconductor"). Here, the structure of a semiconductor device that uses silicon carbide (SiC), for example, as the wide-bandgap semiconductor (that is, a silicon carbide semiconductor device) will be described as an example. FIG. 1 is a cross-sectional view illustrating the structure of the semiconductor device according to the embodiment. FIGS. 2A and 2B are an enlarged cross-sectional view illustrating a cross-sectional shape for the gate trenches illustrated in FIG. 1 and an impurity concentration profile thereof, respectively. FIGS. 3A & 3B and 4A & 4B are cross-sectional views illustrating other examples of cross-sectional shapes for the gate trenches illustrated in FIG. 1 and their respective impurity concentration profiles.

In order to better show the overall structure of the semiconductor device for the various embodiments, FIG. 1 only illustrates gate trenches (trenches) 9 schematically. FIGS. 2A to 4A illustrate the cross-sectional shape of the gate trenches 9 illustrated in FIG. 1 in more detail. FIG. 1 only illustrates two unit cells (the functional unit for elements) and does not show any other unit cells or edge termination regions that may be adjacent to these unit cells.

Here, the "active region" is a region that provides current paths through which primary currents flow when the device is in the ON state. The "edge termination region" is a region between the active region and the edges of the chip. The edge termination region surrounds the periphery of the active region and reduces the strength of the electric field on the front surface (hereinafter, "substrate front surface") side of a semiconductor substrate made of silicon carbide (a silicon carbide substrate) 10 so as to provide a sufficiently high withstand voltage. The term "withstand voltage" refers to the voltage limit up to which the device will not malfunction or suffer damage.

The silicon carbide semiconductor device according to the embodiment as illustrated in FIG. 1 is a vertical MOSFET including trench-gate MOS gates formed in the front surface side (surface on a silicon carbide layer 22 side) of the silicon carbide substrate (semiconductor chip) 10. The silicon carbide substrate 10 is an epitaxial substrate in which silicon carbide layers (first and second semiconductor layers) 21 and 22 of prescribed conductivity types and impurity concentrations are epitaxially grown in order on the front surface of an n+ starting substrate (semiconductor substrate) 1. The n+ starting substrate 1 is an n+ drain region.

The MOS gates are formed in the active region on the substrate front surface side. Each MOS gate includes first and second p+ regions (first and second semiconductor regions) 3 and 4, an n-type current diffusion region 5, a p-type base region 6, an n+ source region (third semiconductor region) 7, a p++ contact region 8, a gate trench (trench) 9, a gate insulating film 11, and a gate electrode 12.

The first and second p+ regions 3 and 4 are both selectively formed within the n− silicon carbide layer 21. Each first p+ region 3 is formed in a mesa portion between adjacent gate trenches 9 and separated from the gate trenches 9. The first p+ region 3 contacts the p-type silicon carbide layer 22 (the p-type base region 6). Moreover, in the thickness direction of the n− silicon carbide layer 21 (that is, the direction going from the substrate front surface towards the substrate rear surface; the vertical direction), the first p+ region 3 reaches a position that is deeper towards the substrate rear surface (rear surface of the silicon carbide substrate 10) side from the boundary with the p-type silicon carbide layer 22 than is the bottom surface of the gate trench 9.

The second p+ region 4 is formed separated from the first p+ region 3 and faces the bottom surface and bottom surface corners 9a of the gate trench 9 in the thickness direction. The second p+ region 4 may cover the bottom surface and the bottom surface corners 9a of the gate trench 9. Here, "the bottom surface corners 9a of the gate trench 9" refers to the intersections between the bottom surface and sidewalls of the gate trench 9. The second p+ region 4 reaches a prescribed depth in the thickness direction of the n− silicon carbide layer 21 from a position that is deeper towards the substrate rear surface (rear surface of the silicon carbide substrate 10) side than is the interface between the n− silicon carbide layer 21 and the p-type silicon carbide layer 22.

The substrate rear surface-side depth position of the second p+ region 4 from the interface between the n− silicon carbide layer 21 and the p-type silicon carbide layer 22 may be the same as the corresponding depth position of the first p+ region 3. Forming the first and second p+ regions 3 and 4 in this manner makes it possible to form the p-n junctions with the n− drift region 2 (and with the n-type current diffusion region 5 described below) at positions that are deeper towards the substrate rear surface side than the bottom surface of the gate trench 9. This, in turn, makes it possible to prevent high electric fields from being applied to the portion of the gate insulating film 11 on the bottom surface of the gate trench 9.

The n-type current diffusion region 5 may be formed between the first and second p+ regions 3 and 4. The n-type current diffusion region 5 is a so-called current diffusion layer (CSL) formed on a current path surrounding the second p+ region 4 to reduce carrier spreading resistance. The n-type current diffusion region 5 is formed uniformly in the direction parallel to the substrate front surface (the lateral direction) and contacts the first and second p+ region 3 and 4 as well as the p-type silicon carbide layer 22 (the p-type base region 6), for example.

The depth position of the n-type current diffusion region 5 from the interface between the n− silicon carbide layer 21 and the p-type silicon carbide layer 22 may be the same as the corresponding depth positions of the first and second p+ regions 3 and 4 or may reach a position that is deeper towards the substrate rear surface side than the corresponding depth positions of the first and second p+ regions 3 and 4. Here, the "current path surrounding the second p+ region 4" refers to the path for current that flows from the drain side to the source side through an n-type inversion layer (channel) that forms along the gate trench 9 when the MOSFET is ON.

The portion of the n− silicon carbide layer 21 other than the first and second p+ regions 3 and 4 and the n-type current diffusion region 5 is the n− drift region 2. The n+ source region 7 and the p++ contact region 8 are both selectively formed within the p-type silicon carbide layer 22 and contact one another. The depth of the p++ contact region 8 may be greater than that of the n+ source region 7, for example. The portion of the p-type silicon carbide layer 22 other than the n+ source region 7 and the p++ contact region 8 is the p-type base region 6.

The gate trench 9 goes from the substrate front surface through the n+ source region 7 and the p-type base region 6 and reaches the n-type current diffusion region 5. The bottom surface and the bottom surface corners 9a of the gate trench 9 face the second p+ region 4 in the thickness direction of the n silicon carbide layer 21. The bottom surface and the bottom surface corners 9a of the gate trench 9 may contact the second p+ region 4 or may be positioned within the second p+ region 4.

Moreover, it is preferable that the bottom surface and the sidewalls of the gate trench 9 be connected together smoothly. In other words, it is preferable that the bottom surface corners 9a of the gate trench 9 have a substantially arc-shaped cross-sectional shape, and it is preferable that the bottom surface and the sidewalls of the gate trench 9 be connected together in a substantially curved shape. This makes it possible to reduce local concentration of the electric field on the gate insulating film 11 formed along the inner walls of the gate trench 9.

Moreover, upper corners 9b of the gate trench 9 either connect the sidewalls to the substrate front surface in a planar shape or smoothly connect the sidewalls to the substrate front surface in a substantially curved shape. Here, "upper corners 9b of the gate trench 9" refers to the intersections between the front surface of the silicon carbide substrate 10 and the sidewalls of the gate trench 9. The cross-sectional shape of the gate trench 9 will be described in more detail later.

The gate insulating film 11 is formed along the inner walls of the gate trench 9. The thickness t1 of the gate insulating film 11 is substantially uniform over the entire inner wall surface of the gate trench 9. The gate electrode 12 is formed on the gate insulating film 11 inside of the gate trench 9. An upper surface 12a of the gate electrode 12 is positioned lower on the silicon carbide substrate 10 side than a surface 11a of a portion of the gate insulating film 11 on the substrate front surface. In other words, the interface between the gate electrode 12 and an interlayer insulating film 13 is further towards the silicon carbide substrate 10 side than the interface between the interlayer insulating film 13 and the gate insulating film 11. Moreover, the upper surface 12a of the gate electrode 12 may be positioned deeper within the gate trench 9 than the front surface of the silicon carbide substrate 10 as long as the gate electrode 12 is still filled into the gate trench 9 up to a height position facing the $n^+$ source region 7 on either side of the gate insulating film 11. Here, "the upper surface 12a of the gate electrode 12" and "the surface 11a of the portion of the gate insulating film 11 on the substrate front surface" refer to interfaces (contact surfaces) with the interlayer insulating film 13 (described later).

Due to the thickness t1 of the gate insulating film 11 being substantially uniform and the upper surface 12a of the gate electrode 12 being positioned lower inside the gate trench 9 than the surface 11a of the portion of the gate insulating film 11 on the substrate front surface, as described above, the distance between the gate electrode 12 and the p-type base region 6 that face one another with the gate insulating film 11 sandwiched therebetween can be set to be substantially equal throughout the thickness direction of the p-type base region 6. Moreover, the upper surface 12a of the gate electrode 12 being positioned lower inside the gate trench 9 than the surface 11a of the portion of the gate insulating film 11 on the substrate front surface makes it possible to increase the planarity of the interlayer insulating film 13. This reduces the surface irregularity of the interlayer insulating film 13, thereby making it possible to inhibit penetration of impurities or the like from a source pad 15 side (described later) through the interlayer insulating film 13 to the gate electrode 12 side.

Furthermore, the gate electrode 12 is electrically connected to a gate pad (not illustrated in the figures) by a portion that is not illustrated. The interlayer insulating film 13 is formed so as to cover the gate electrode 12 everywhere on the front surface of the substrate from the active region to the edge termination region. A source electrode (first electrode) 14 contacts the $n^+$ source region 7 and the $p^{++}$ contact region 8 via a contact hole formed in the interlayer insulating film 13 and is thus electrically connected to the p-type base region 6, the $n^+$ source region 7, and the $p^{++}$ contact region 8. Moreover, the source electrode 14 is electrically insulated from the gate electrode 12 by the interlayer insulating film 13.

The source electrode 14 may be formed just within the contact hole. The source pad 15 is formed on the interlayer insulating film 13 and the source electrode 14 so as to fill in the contact hole. The source pad 15 is electrically connected to the source electrodes 14 of all of the unit cells. A drain electrode (second electrode) 16 is formed spanning over the entire rear surface of the silicon carbide substrate 10 (that is, the rear surface of the $n^+$ starting substrate 1). A drain pad (electrode pad) 17 is formed on the surface of the drain electrode 16.

The p-type silicon carbide layer 22 is removed across the entire edge termination region to form, in the front surface of the silicon carbide substrate 10, a level difference (not illustrated in the figures) that recedes towards the drain side and thus makes the edge termination region lower than the active region. In other words, the $n^-$ silicon carbide layer 21 is exposed on the substrate front surface in the edge termination region. A connecting portion (hereinafter, a "stair in the level difference") between (the upper level and lower level of) the substrate front surface in the active region and in the edge termination region may be slanted or substantially orthogonal relative to the substrate front surface. The p-type base region 6 is exposed to this stair in the level difference.

Moreover, the first $p^+$ region 3 that is positioned on the outermost side of the active region is exposed from the stair in the level difference to the surface of the $n^-$ silicon carbide layer 21 exposed on the substrate front surface in the edge termination region. Here, "exposed" means arranged contacting the interlayer insulating film (field oxide film) 13 on the substrate front surface. Moreover, a voltage withstand structure such as a junction termination extension (JTE) structure, for example, is formed in the $n^-$ silicon carbide layer 21 that is exposed on the substrate front surface in the edge termination region.

The JTE structure includes a plurality of p-type regions arranged adjacent to one another in a concentric circle pattern surrounding the periphery of the active region, with the regions arranged further outwards (that is, towards the edges of the chip) having increasingly lower impurity concentrations. The innermost p-type region (that is, on the active region side) of the JTE structure is connected to the first $p^+$ region 3 that is arranged on the outermost side of the active region. The voltage withstand structure arranged in the edge termination region is not limited to being a JTE structure and may be modified in various ways. For example, instead of a JTE structure, a combination of components such as a guard ring, a field plate, and a RESURF portion may be arranged.

Next, various examples of cross-sectional shapes of the gate trench 9 will be described with reference to FIGS. 2A to 4A. FIGS. 2A to 4A illustrate cross-sectional shapes for the gate trench 9, and FIGS. 2B to 4B illustrate n-type impurity concentration profiles 41a, 42, and 43 for the $n^+$ source region 7 for the respective examples.

Figures 3A, 3B:
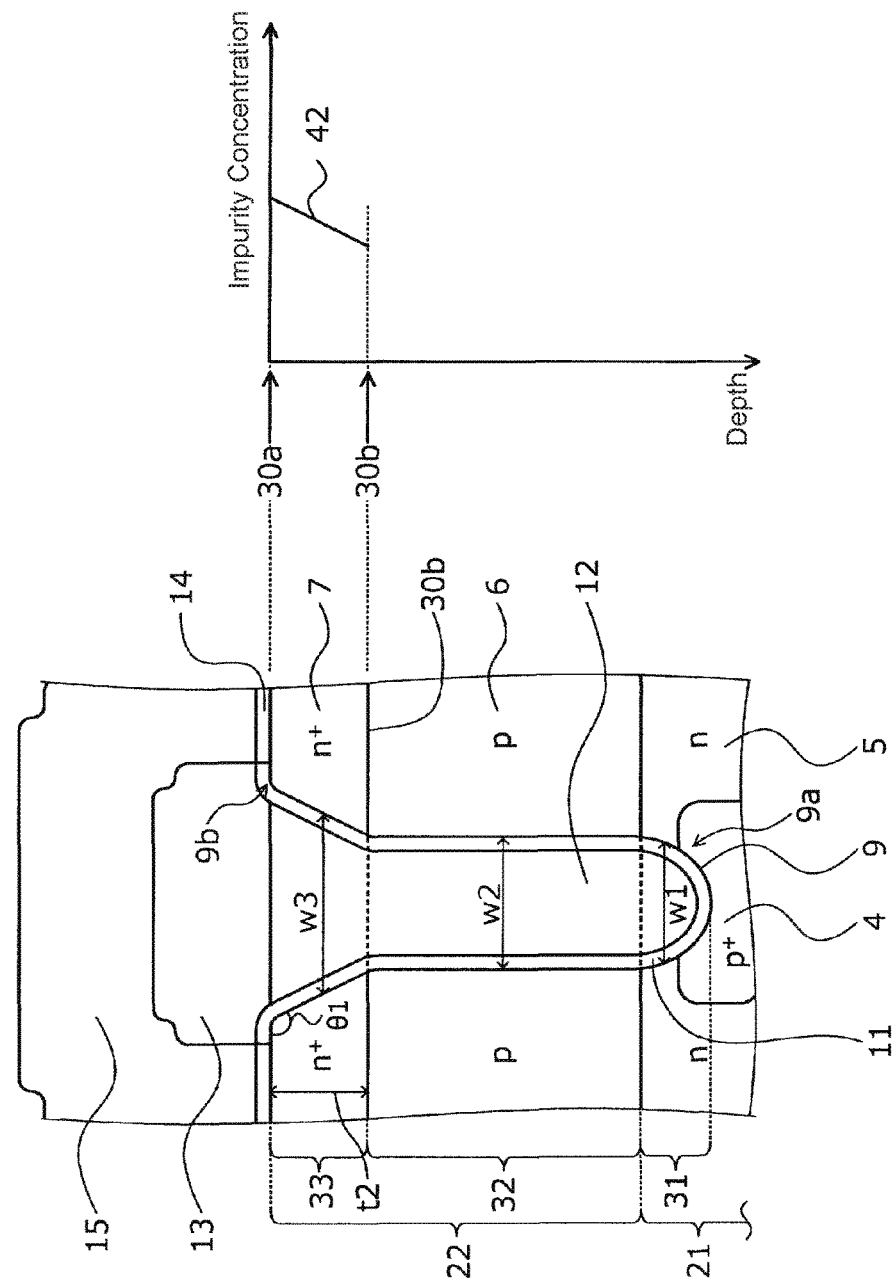
FIGS. 3A and 3B are a cross-sectional view illustrating an example of another cross-sectional shape for the gate trenches illustrated in FIG. 1 and an impurity concentration profile thereof, respectively.

As illustrated in FIGS. 2A, 3A, and 4A, the gate trench 9 in each of these embodiments includes a first portion 31 that includes the bottom surface of the gate trench 9, a second portion 32 that is connected to the substrate front surface side of the first portion 31, and a third portion 33 that is connected to the substrate front surface side of the second portion 32. In FIGS. 2A, 3A, and 4A, the boundaries between the first to third portions 31 to 33 of the gate trench 9 are indicated by dashed lines.

In the first portion 31 of the gate trench 9, the n-type current diffusion region 5 is exposed along the bottom surface and the sidewalls. Moreover, when the bottom surface and the bottom surface corners 9a of the gate trench 9 contact the second p⁺ region 4, the second p⁺ region 4 is exposed along the bottom surface and sidewalls of the first portion 31 of the gate trench 9, and the n-type current diffusion region 5 is exposed along the sidewalls in a continuous manner with the second p⁺ region 4.

In the second portion 32 of the gate trench 9, the p-type base region 6 is exposed along the sidewalls. The portions of the p-type base region 6 that run along the sidewalls of the second portion 32 of the gate trench 9 substantially function as channels. Therefore, although the angle of inclination and curvature of the sidewalls of the second portion 32 of the gate trench 9 are determined by the required device performance, it is preferable that the width w2 of the second portion 32 of the gate trench 9 be greater than or equal to the width w1 of the first portion 31 (that is, w2≥w1). This makes it possible to make the thickness t1 of the gate insulating film 11 as close to uniform as possible along the entire inner wall surface of the gate trench 9.

In the third portion 33 of the gate trench 9, the n⁺ source region 7 is exposed along the sidewalls. The widths w1 to w3 of the first to third portions 31 to 33 of the gate trench 9 are determined by the impurity concentrations of the regions that are respectively exposed along the sidewalls of the first to third portions 31 to 33. More specifically, the widths w1 to w3 increase as the impurity concentrations of the regions that are exposed along the sidewalls of the first to third portions 31 to 33 increase. In other words, the impurity concentration of the n⁺ source region 7 that is exposed along the sidewalls of the third portion 33 of the gate trench 9 is higher than the impurity concentrations of the n-type current diffusion region 5 and the p-type base region 6 that are respectively exposed along the sidewalls of the first and second portions 31 and 32 of the gate trench 9. Therefore, the width w3 of the third portion 33 of the gate trench 9 is greater than the widths w1 and w2 of the first and second portions 31 and 32 of the gate trench 9 (that is, w3>w1 and w3>w2). As long as the width w3 of the third portion 33 of the gate trench 9 is greater than at least the width w1 of the first portion 31 of the gate trench 9, the advantageous effects of the width w3 of the third portion 33 of the gate trench 9 being greater than the widths of the other portions can be achieved.

Moreover, configuring the n-type impurity concentration profiles 41a, 42, and 43 for the n⁺ source region 7 in various ways makes it possible to give at least the upper corners 9b of the gate trench 9 a smooth shape in which the width w3 increases going from the second portion 32 side towards the opening side (that is, towards the substrate front surface side). This makes it possible to make the thickness t1 of the gate insulating film 11 substantially uniform along the entire inner wall surface of the gate trench 9. Furthermore, the increase in the width w3 of the third portion 33 of the gate trench 9 going from the second portion 32 side towards the opening side makes it possible to inhibit local concentration of the electric field on the gate insulating film 11, even when the thickness t1 of the gate insulating film 11 is uniform along the entire inner wall surface of the gate trench 9.

For example, as illustrated in FIG. 2B, in the n-type impurity concentration profile 41a for the n⁺ source region 7, the impurity concentration is uniform going from the interface 30a with the source electrode 14 towards the interface 30b with the p-type base region 6 (that is, over the entire thickness t2 of the n⁺ source region 7). A tail portion 41b in which the impurity concentration decreases gradually at a prescribed rate (slope) going deeper towards the substrate rear surface side may be formed in the p-type base region 6 in a continuous manner with the n-type impurity concentration profile 41a of the n⁺ source region 7. Here, "the thickness t2 of the n⁺ source region 7" refers to the distance from the interface 30a between the source electrode 14 and the n⁺ source region 7 to the interface 30b between the n⁺ source region 7 and the p-type base region 6.

Forming the n⁺ source region 7 to have this n-type impurity concentration profile 41a makes it possible to make the width w3 of the third portion 33 of the gate trench 9 greater than the width w1 of the first portion 31. Furthermore, including the tail portion 41b on the n-type impurity concentration profile 41a of the n⁺ source region 7 results in stepped portions 9c that are continuous with the sidewalls of the third portion 33 but have a different inclination θ2 than the sidewalls of the third portion 33 being formed in the sidewalls of the second portion 32 of the gate trench 9. The inclination θ2 of the stepped portions 9c in the sidewalls of the second portion 32 of the gate trench 9 relative to the substrate front surface of the silicon carbide substrate 10 is greater than the inclination θ1 of the sidewalls of the third portion 33 relative to the substrate front surface of the silicon carbide substrate 10 (that is, θ2>θ1). In FIG. 2A, the inclination θ2 is illustrated as the angle relative to the interface 30b between the n⁺ source region 7 and the p-type base region 6, which is substantially parallel to the front surface of the silicon carbide substrate 10. The width w2' of the second portion 32 of the gate trench 9 at the stepped portions 9c decreases at a prescribed rate going, for the depth t3 of the tail portion 41b, from the interface 30b between the n⁺ source region 7 and the p-type base region 6 towards the substrate rear surface.

In the alternative, as illustrated in FIG. 3B, in the n-type impurity concentration profile 42 for the n⁺ source region 7, the impurity concentration may decrease at a prescribed rate and in a substantially linear manner going from the interface 30a with the source electrode 14 towards the interface 30b with the p-type base region 6 (that is, for the entire thickness t2 of the n⁺ source region 7). As illustrated in FIG. 3A, even when the n⁺ source region 7 has this n-type impurity concentration profile 42, the width w3 of the third portion 33 of the gate trench 9 can still be formed to be greater than the width w1 of the first portion 31. Furthermore, this makes it possible to make the width w3 of the third portion 33 of the gate trench 9 increase at a prescribed rate and in a substantially linear manner going from the interface 30b between the n⁺ source region 7 and the p-type base region 6 towards the opening side. In other words, this makes it possible to make the inclination θ1 of the sidewalls of the third portion 33 of the gate trench 9 relative to the substrate front surface of the silicon carbide substrate 10 an obtuse angle (that is, θ1>90°).

In still another example, as illustrated in FIG. 4B, in the n-type impurity concentration profile 43 for the n⁺ source region 7, the impurity concentration may decrease exponentially going from the interface 30a with the source electrode 14 towards the interface 30b with the p-type base region 6 (that is, for the entire thickness t2 of the n⁺ source region 7). As illustrated in FIG. 4A, even when the n⁺ source region 7 has this n-type impurity concentration profile 43, the width w3 of the third portion 33 of the gate trench 9 can still be formed to be greater than the width w1 of the first portion 31. Furthermore, this makes it possible to give the upper corners 9b of the gate trench 9 a substantially arc-shaped cross-sectional shape that curves in a convex manner towards the interior of the gate trench 9 with a radius of curvature that is less than the thickness t2 of the n+ source region 7. In FIG. 4A, the curved shape of the upper corners 9b of the gate trench 9 is indicated by the dotted arcs. This makes it possible to make the width w3 of the third portion 33 of the gate trench 9 decrease gradually going from the opening side towards the second portion 32 side.

When the bottom surface and the bottom surface corners 9a of the gate trench 9 contact the second p+ region 4, the cross-sectional shape of the bottom surface and the bottom surface corners 9a of the gate trench 9 may be changed by adjusting the impurity concentration of the second p+ region 4. In other words, the n-type impurity concentration profile of the second p+ region 4 may be configured to decrease going from the substrate front surface towards the substrate rear surface in order to achieve a cross-sectional shape in which the bottom surface and the sidewalls of the gate trench 9 are smoothly connected together.

Figure 5:
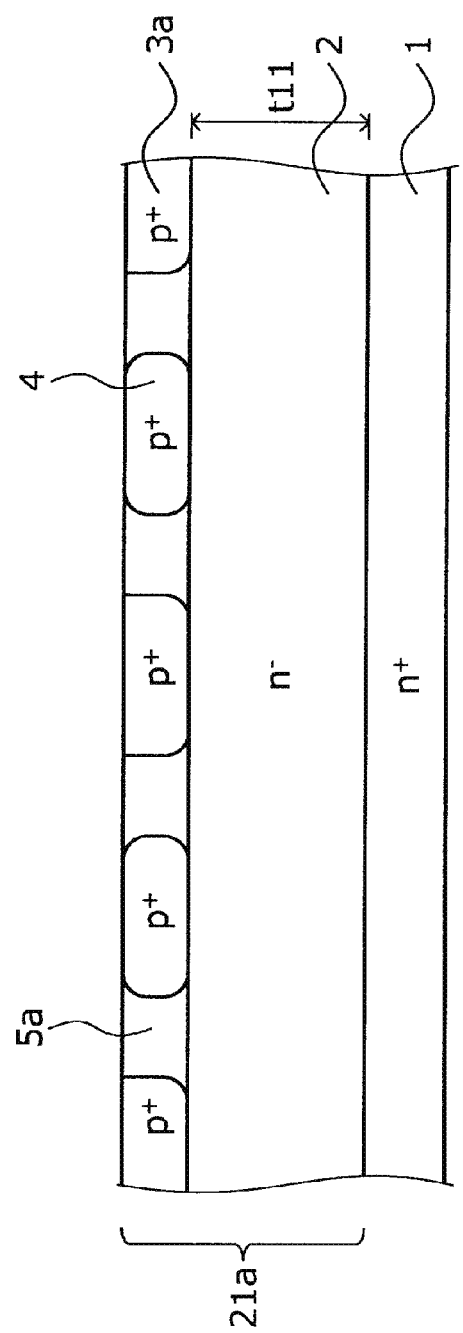
FIG. 5 is a cross-sectional view illustrating a state of the semiconductor device according the embodiment while being manufactured.

Next, a method of manufacturing the semiconductor device according to the embodiment will be described. FIGS. 5 to 9 are cross-sectional views illustrating states of the semiconductor device according to the embodiment while being manufactured. First, as illustrated in FIG. 5, an n+ monocrystalline substrate doped with n-type impurities such as nitrogen (N) is prepared as the n+ starting substrate (starting wafer) 1, for example. The front surface of the n+ starting substrate 1 may be the (0001) plane (the so-called Si plane), for example. The n+ starting substrate 1 becomes an n+ drain region.

Next, an n− silicon carbide layer 21a that is doped with n-type impurities such as nitrogen, for example, and will become the n− silicon carbide layer (a first epitaxial layer) 21 illustrated in FIG. 1 is epitaxially grown on the front surface of the n+ starting substrate 1. The thickness and impurity concentration of the n− silicon carbide layer 21a may respectively be approximately 10 μm and approximately $3 \times 10^{15}/cm^3$, for example. Then, using a plasma chemical vapor deposition (CVD) process or the like, for example, an oxide film (a silicon oxide ($SiO_2$) film; not illustrated in the figure) with a thickness of approximately 1.5 μm, for example, is deposited on the surface of the n− silicon carbide layer 21a.

Next, using a photolithography process, the oxide film on portions corresponding to formation regions for the first and second p+ regions 3 and 4 is removed. Then, using the remaining portions of the oxide film as a mask (an oxide film mask), p-type impurities such as aluminum (Al) are ion-implanted to selectively form the second p+ region 4 and a p+ region (hereinafter, a "p+ partial region") 3a in the surface layer of the n− silicon carbide layer 21a. This p+ partial region 3a is part of the first p+ region 3.

The ion implantation depth and impurity concentration for both the p+ partial region 3a and the second p+ region 4 may respectively be approximately 0.5 μm and approximately $5 \times 10^{18}/cm^3$, for example. It is preferable that the ion implantation depth of the p+ partial region 3a and the second p+ region 4 be less than or equal to 0.7 μm (a depth at which crystal defects can still be repaired using a heat treatment). The p+ partial region 3a and the second p+ region 4 may alternatively be formed separately using separate ion implantation processes.

Next, the oxide film mask used to form the p+ partial region 3a and the second p+ region 4 is partially removed to expose a portion of the n− silicon carbide layer 21a corresponding to a formation region for the n-type current diffusion region 5. Then, using the oxide film mask as a mask, n-type impurities such as nitrogen are ion-implanted to form an n-type region (hereinafter, an "n-type partial region") 5a in the surface layer of the n− silicon carbide layer 21a. This n-type partial region 5a is part of the n-type current diffusion region 5. The ion implantation depth and impurity concentration for the n-type partial region 5a may respectively be approximately 0.5 μm and approximately $1 \times 10^{17}/cm^3$, for example.

The portion of the n− silicon carbide layer 21a other than the p+ partial region 3a, the second p+ region 4, and the n-type partial region 5a becomes the n− drift region 2. The thickness t11 of the n− drift region 2 is set to approximately 3 μm to 100 μm (3 μm≤t11≤100 μm), for example, where the thickness is increased proportional to the magnitude of the withstand voltage of the device. Here, the order in which the p+ partial region 3a and second p+ region 4 are formed and the n-type partial region 5a is formed may be reversed. Then, the oxide film mask on the n− silicon carbide layer 21a is removed.

Figure 6:
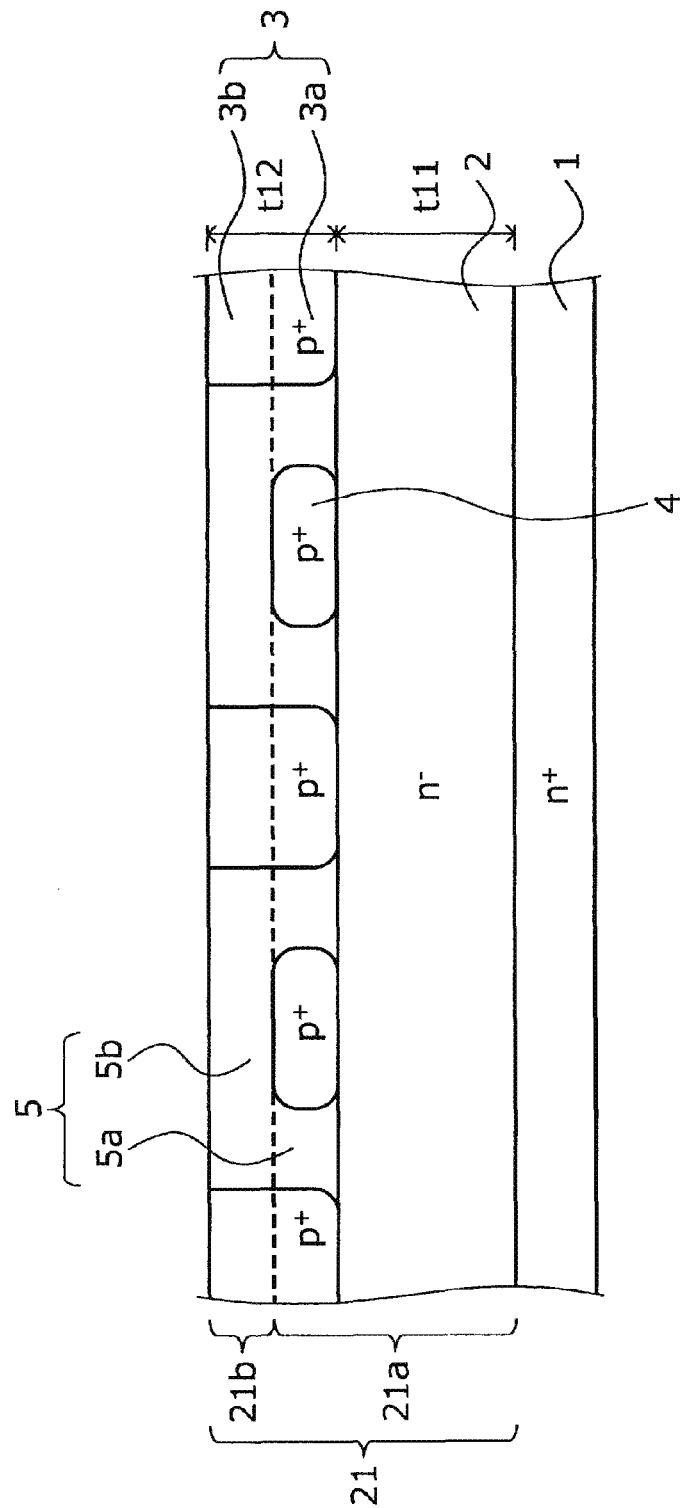
FIG. 6 is a cross-sectional view illustrating a state of the semiconductor device according the embodiment while being manufactured.

Next, as illustrated in FIG. 6, an n− silicon carbide layer 21b that is doped with n-type impurities such as nitrogen, for example, and will become part of the n− silicon carbide layer 21 illustrated in FIG. 1 is epitaxially grown on the n− silicon carbide layer 21a. The thickness and impurity concentration of the n− silicon carbide layer 21b are equal to those of the n− silicon carbide layer 21a, for example. It is preferable that the thickness of the n− silicon carbide layer 21b be large enough to allow the thickness t13 (see FIG. 8) of the portion of the n-type current diffusion region 5 running along the gate trench 9 to function as a current path when the MOSFET is ON, and may therefore be approximately 0.3 μm to 0.7 μm, for example.

Next, using a plasma CVD process or the like, for example, an oxide film (an $SiO_2$ film; not illustrated in the figure) with a thickness of approximately 1.5 μm, for example, is deposited on the surface of the n− silicon carbide layer 21b. Then, using a photolithography process, the oxide film on a portion corresponding to the formation region for the first p+ region 3 is removed. Next, using the remaining portions of the oxide film as a mask (an oxide film mask), p-type impurities such as aluminum are ion-implanted to selectively form a p+ partial region 3b in the n− silicon carbide layer 21b.

Here, the p+ partial region 3b is formed in the portion of the n− silicon carbide layer 21b facing the p+ partial region 3a in the thickness direction and has a depth that reaches the p+ partial region 3a. The width and impurity concentration of the p+ partial region 3b are substantially equal to those of the p+ partial region 3a, for example. This p+ partial region 3b is part of the first p+ region 3. The first p+ region 3 is thus formed by connecting together the p+ partial regions 3a and 3b in the thickness direction (the vertical direction).

Next, the oxide film mask used to form the p+ partial region 3b is partially removed to expose a portion of the n− silicon carbide layer 21b corresponding to a formation region for the n-type current diffusion region 5. Then, using the oxide film mask as a mask, n-type impurities such as nitrogen are ion-implanted to form an n-type partial region 5b in the surface layer of the n− silicon carbide layer 21b. The impurity concentration of the n-type partial region 5b may be substantially equal to that of the n-type partial region 5a, for example.

This n-type partial region 5b is part of the n-type current diffusion region 5. The n-type partial regions 5a and 5b are formed so as to contact one another in at least one portion. The n-type current diffusion region 5 is thus formed by connecting together the n-type partial regions 5a and 5b in the thickness direction. Here, the order in which the p+ partial region 3b and the n-type partial region 5b are formed may be reversed. Then, the oxide film mask on the n⁻ silicon carbide layer 21 (the n⁻ silicon carbide layer 21*b*) is removed.

Figure 7:
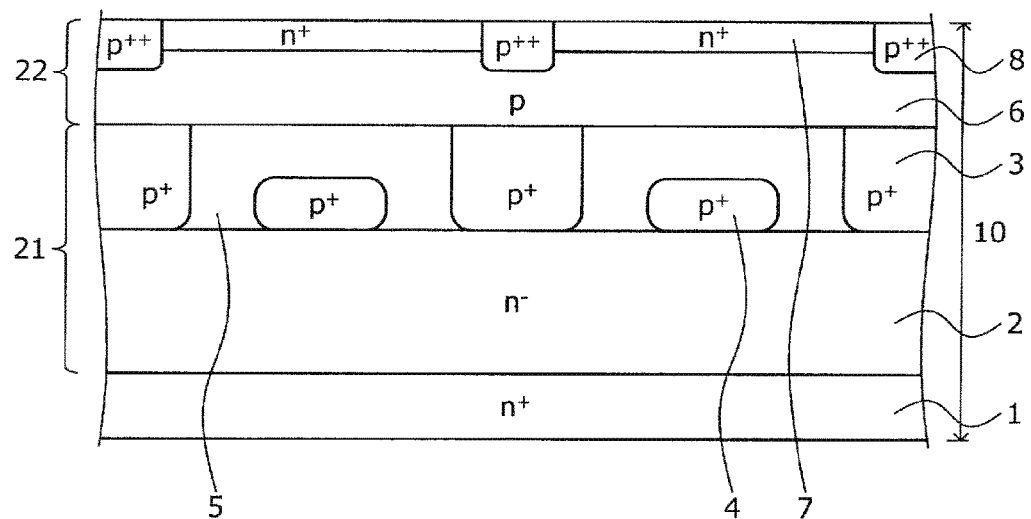
FIG. 7 is a cross-sectional view illustrating a state of the semiconductor device according the embodiment while being manufactured.

Next, as illustrated in FIG. 7, the p-type silicon carbide layer (a second epitaxial layer) 22, which is doped with p-type impurities such as aluminum, for example, is epitaxially grown on the n⁻ silicon carbide layer 21. The thickness and impurity concentration of the p-type silicon carbide layer 22 may respectively be approximately 1.3 μm and approximately $4 \times 10^{17}/cm^3$, for example. The steps thus far form the silicon carbide substrate (semiconductor wafer) 10 in which the n⁻ silicon carbide layer 21 and the p-type silicon carbide layer 22 are deposited in order the n⁺ starting substrate 1.

Next, using a photolithography process, a photoresist mask that covers the active region (center portion of the chip) is formed on the surface of the p-type silicon carbide layer 22. Then, using this photoresist mask as a mask, an etching process is performed to remove the p-type silicon carbide layer 22 across the entire edge termination region (the entire peripheral region of the chip), leaving the p-type silicon carbide layer 22 remaining only in the active region. This etching process may be a dry etching process performed using a fluorinated gas such as sulfur hexafluoride ($SF_6$), for example.

Here, a small amount of the surface layer of the n⁻ silicon carbide layer 21 may be removed along with the p-type silicon carbide layer 22 by removing approximately 1.4 μm of thickness from the silicon carbide layers in the edge termination region, for example. This forms the level difference in the front surface of the silicon carbide substrate 10 that makes the edge termination region lower than the active region, and also exposes the n silicon carbide layer 21 on the substrate front surface in the edge termination region.

Next, using a plasma CVD process or the like, for example, an oxide film (an $SiO_2$ film; not illustrated in the figure) with a thickness of approximately 1.5 μm, for example, is deposited spanning from the surface of the p-type silicon carbide layer 22 to the surface of the n⁻ silicon carbide layer 21 that is exposed on the substrate front surface. Then, using a photolithography process, the oxide film on a portion corresponding to a formation region for the n⁺ source region 7 is removed.

Next, using the remaining portions of the oxide film as a mask (an oxide film mask), n-type impurities such as phosphorus (P) are ion-implanted to selectively form the n⁺ source region 7 in the surface layer of the p-type silicon carbide layer 22. Here, the dose of ion-implanted n-type impurities should be set to be greater than the concentration of p-type impurities in the p-type silicon carbide layer 22 in order to invert the conductivity type of a portion of the p-type silicon carbide layer 22 to n-type. Moreover, the n⁺ source region 7 should be formed to have one of the n-type impurity concentration profiles 41*a*, 42, and 43 described above (see FIGS. 2B, 3B, and 4B). Then, the oxide film mask used to form the n⁺ source region 7 is removed.

Next, using a plasma CVD process, for example, another oxide film (an $SiO_2$ film; not illustrated in the figure) with a thickness of approximately 1.5 μm, for example, is deposited spanning from the surface of the p-type silicon carbide layer 22 to the surface of the n⁻ silicon carbide layer 21 that is exposed on the substrate front surface. Then, using a photolithography process, the oxide film on a portion corresponding to a formation region for the p⁺⁺ contact region 8 is removed.

Next, using the remaining portions of the oxide film as a mask (an oxide film mask), p-type impurities such as aluminum are ion-implanted in order to increase the p-type impurity concentration of a portion of the p-type silicon carbide layer 22 and thus selectively form the p⁺⁺ contact region 8. Then, the oxide film mask used to form the p⁺⁺ contact region 8 is removed. The order in which the n⁺ source region 7 and the p⁺⁺ contact region 8 are formed may be reversed. The portion of the p-type silicon carbide layer 22 other than the n⁺ source region 7 and the p⁺⁺ contact region 8 becomes the p-type base region 6.

Next, using a plasma CVD process, for example, another oxide film (an $SiO_2$ film; not illustrated in the figure) with a thickness of approximately 1.5 μm, for example, is deposited spanning from the surface of the p-type silicon carbide layer 22 to the surface of the n⁻ silicon carbide layer 21 that is exposed on the substrate front surface. Then, using a photolithography process, the oxide film on a portion corresponding to a formation region for one p-type region among the plurality of p-type regions included in the JTE structure is removed.

Next, using the remaining portions of the oxide film as a mask (an oxide film mask), p-type impurities such as aluminum are ion-implanted in order to increase the p-type impurity concentration of a portion of the p-type silicon carbide layer 22 and thus selectively form the abovementioned p-type region of the JTE structure. Then, the oxide film mask used to form this p-type region is removed.

This group of processes including forming an oxide film mask for forming a p-type region, ion-implanting p-type impurities, and then removing the oxide film mask is repeated for as many p-type regions as are included in the JTE structure. The arrangement of the p-type regions may be modified in various ways as long as the innermost p-type region of the JTE structure is connected to the outermost first p⁺ region 3 in the active region.

Next, all of the regions formed using ion implantation (the first and second p⁺ regions 3 and 4, the n-type current diffusion region 5, the n⁺ source region 7, the p⁺⁺ contact region 8, and the p-type regions of the JTE structure) are activated using a heat treatment (activation annealing). This activation annealing process may be performed at a temperature of approximately 1700° C. in an inert gas atmosphere, for example.

Figure 8:
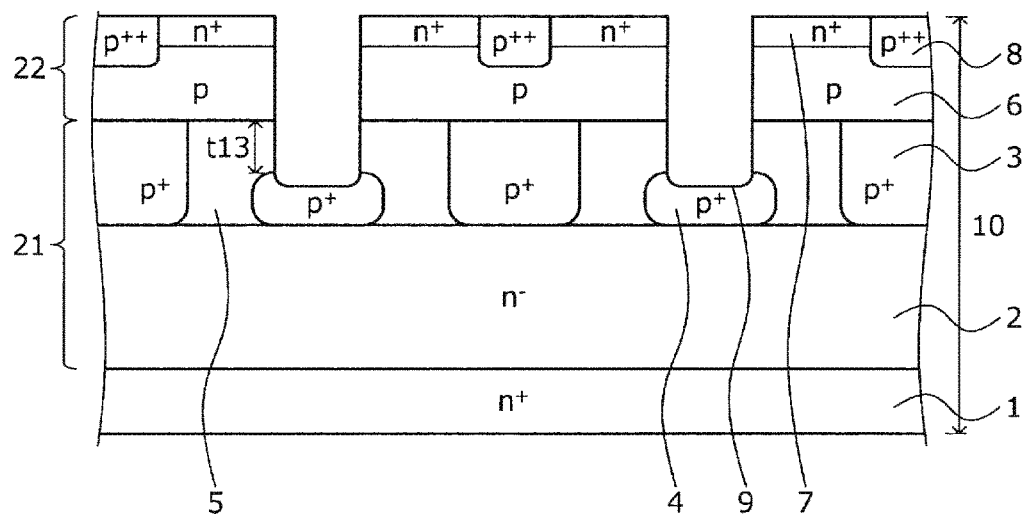
FIG. 8 is a cross-sectional view illustrating a state of the semiconductor device according the embodiment while being manufactured.

Next, as illustrated in FIG. 8, using a plasma CVD process, for example, another oxide film (an $SiO_2$ film; not illustrated in the figure) with a thickness of approximately 1.5 μm, for example, is deposited spanning from the surface of the p-type silicon carbide layer 22 to the surface of the n⁻ silicon carbide layer 21 that is exposed on the substrate front surface. Then, using a photolithography process, the oxide film on a portion corresponding to a formation region for the gate trench 9 is removed.

Next, using the remaining portions of the oxide film as a mask (an oxide film mask), an etching process is performed to form the gate trench 9 going through the n⁺ source region 7 and the p-type base region 6 and reaching the n-type current diffusion region 5. The bottom surface of the gate trench 9 may reach the second p⁺ region 4. This etching process may be a dry etching process performed using a fluorinated gas, for example.

Using a fluorinated gas for the etching process for forming the gate trench 9 facilitates etching of the silicon carbide while also protecting the sidewalls of the resulting gate trench 9, thereby making it possible for the etching process to proceed anisotropically, with the etching width remaining substantially constant in the depth direction of the gate trench 9. In other words, the gate trench 9 is formed having the same width throughout the depth direction. Then, the oxide film mask used to form the gate trench 9 is removed.

Next, in an atmosphere that contains hydrogen ($H_2$) and silane ($SiH_4$), such as a hydrogen gas atmosphere inevitably containing silane or in a mixed gas atmosphere containing hydrogen and silane, a heat treatment is performed at a temperature of approximately 1500° C., for example, to etch the sidewalls of the gate trench 9. The hydrogen gas atmosphere inevitably containing silane is realized when, for example, the inner walls of the processing chamber into which the hydrogen gas is introduced contain SiC, and thus silane will inevitably be mixed into the hydrogen gas atmosphere from the etching of the inner walls of the processing chamber during hydrogen annealing even though only the hydrogen gas is introduced into the chamber. Often, SiC is used in the inner walls of the processing chamber because the hydrogen annealing process requires a temperature of around 1500° C. Alternatively, a mixed gas of hydrogen and silane can be introduced into the processing chamber to realize the atmosphere that contains hydrogen and silane. In this process, the constituent elements of the portions of silicon carbide exposed along the sidewalls of the gate trench 9 are rearranged such that the width w3 of the third portion 33 of the gate trench 9 becomes greater than the width w1 of the first portion 31. Here, "a hydrogen gas atmosphere inevitably containing silane" refers to a gas atmosphere in which although the only gas introduced into the chamber is hydrogen gas, silane gets mixed in as processes are performed in this hydrogen gas atmosphere. Moreover, a "mixed gas atmosphere containing hydrogen and silane" refers to a gas atmosphere formed by introducing both hydrogen gas and silane gas into the chamber.

Next, a first sacrificial oxidation process is performed on the inner walls of the gate trench 9 in the form of a heat treatment at a temperature of approximately 1000° C. in an oxygen ($O_2$) atmosphere, and the thermal oxidation film (sacrificial oxide film) formed in this first sacrificial oxidation process is removed to adjust the width w3 of the third portion 33 of the gate trench 9. The oxidation speed of the silicon carbide layer (the thermal oxidation film growth speed) along the sidewalls of the third portion 33 of the gate trench 9 increases with increases in impurity concentration in the silicon carbide layer. For example, when the phosphorus concentration of the $n^+$ source region 7 is $1\times10^{20}/cm^3$, the oxidation speed of the $n^+$ source region 7 is approximately 1.2 times faster than when the phosphorus concentration of the $n^+$ source region 7 is $1\times10^{18}/cm^3$. Therefore, taking advantage of the differences in thermal oxidation film growth speed makes it possible to further increase the width w3 of the third portion 33 of the gate trench 9 in the first sacrificial oxidation process. This makes it possible to form the gate trench 9 to have a prescribed cross-sectional shape (see FIGS. 2A to 4A). The gate trench 9 can also be formed to have a prescribed cross-sectional shape using just the heat treatment for rearranging the constituent elements of the silicon carbide, and therefore the first sacrificial oxidation process may be omitted. Moreover, the group of processes including the first sacrificial oxidation process and removal of the sacrificial oxide film may be repeated until the third portion 33 of the gate trench 9 reaches a prescribed width w3.

Next, using a heat treatment and an atmospheric pressure CVD process performed in an oxygen gas atmosphere, for example, an oxide film (an $SiO_2$ film) is deposited on the substrate front surface. Then, this oxide film is patterned to remove the portion corresponding to the active region, thus leaving the oxide film covering the edge termination region as a field oxide film (not illustrated in the figure). Next, a second sacrificial oxidation process is performed on the inner walls of the gate trench 9 in the form of a heat treatment at a temperature of approximately 1000° C. in an oxygen gas atmosphere, for example. Then, the thermal oxidation film (sacrificial oxide film) formed in the second sacrificial oxidation process is removed, and any impurities remaining on the inner walls of the gate trench 9 are removed. This second sacrificial oxidation process further increases the width w3 of the third portion 33 of the gate trench 9. Therefore, it is preferable that the heat treatment conditions for rearranging the constituent elements of the silicon carbide, the first and second sacrificial oxidation process conditions, the n-type impurity concentration profile 41a, 42, or 43 of the $n^+$ source region 7, and the like be configured such that the third portion 33 of the gate trench 9 reaches a prescribed width w3 after the second sacrificial oxidation process. The second sacrificial oxidation process may be omitted.

Figure 9:
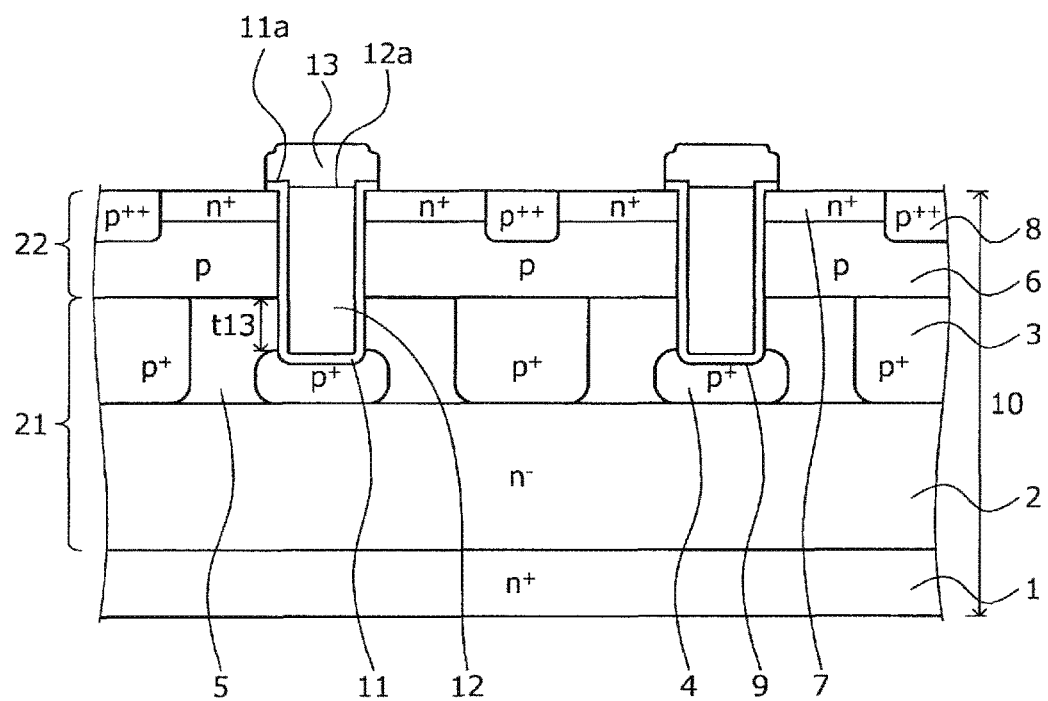
FIG. 9 is a cross-sectional view illustrating a state of the semiconductor device according the embodiment while being manufactured.

Next, as illustrated in FIG. 9, using a thermal CVD process, for example, the gate insulating film 11 is formed on the front surface of the silicon carbide substrate 10 (the surfaces of the $n^+$ source region 7 and the $p^{++}$ contact region 8) and along the inner walls of the gate trench 9. As described above, the width w3 of the third portion 33 of the gate trench 9 is greater than the width w1 of the first portion 31, and therefore this CVD process deposits the gate insulating film 11 in a substantially uniform thickness t1 over the entire inner wall surface of the gate trench 9. The thickness of the gate insulating film 11 may be approximately 40 μm to 120 μm, for example.

Next, a polycrystalline silicon (poly-Si) layer doped with n-type impurities such as phosphorus, for example, is deposited on the gate insulating film 11 so as to fill in the gate trench 9. Then, the polycrystalline silicon layer is patterned using a photolithography process to leave a polycrystalline silicon layer that becomes the gate electrode 12 remaining within the gate trench 9. Next, the polycrystalline silicon layer that becomes the gate electrode 12 is etched back, for example, such that the upper surface 12a of the gate electrode 12 is positioned lower inside the gate trench 9 than the surface 11a of the portion of the gate insulating film 11 on the substrate front surface.

The upper surface 12a of the gate electrode 12 being positioned lower inside the gate trench 9 than the surface 11a of the portion of the gate insulating film 11 on the substrate front surface makes it possible to prevent coverage defects in the source pad (electrode pad) 15 that is formed in a later process.

Next, the interlayer insulating film 13 is formed over the entire front surface of the silicon carbide substrate 10, thus covering the gate insulating film 11, the gate electrode 12, and the field oxide film. The interlayer insulating film 13 may be made of phosphosilicate glass (PSG) or borophosphosilicate glass (BPSG), for example. The thickness of the interlayer insulating film 13 may be approximately 1 μm, for example.

Next, the interlayer insulating film 13 and the gate insulating film 11 are patterned to form contact holes, thereby exposing the $n^+$ source region 7 and the $p^{++}$ contact region 8 inside the contact holes. Then, the interlayer insulating film 13 is planarized using a heat treatment (reflow).

Next, a conductive film such as a nickel (Ni) film, for example, is formed along the surface of the silicon carbide portions (the $n^+$ source region 7 and the $p^{++}$ contact region 8) inside the contact holes and along the surface of the interlayer insulating film 13. This conductive film is then patterned and selectively removed to leave a conductive film that becomes the source electrode 14 remaining only inside of the contact holes, for example.

Next, a conductive film such as a nickel (Ni) film, for example, that will become the drain electrode 16 is formed on the rear surface of the silicon carbide substrate 10 (the rear surface of the n$^+$ starting substrate 1). Then, using a heat treatment at a temperature of approximately 100° C. in an inert gas atmosphere, for example, the respective ohmic contacts (ohmic electrical junctions) are formed between the silicon carbide substrate 10 and the source electrode 14 and drain electrode 16.

Next, using a sputtering process, an aluminum film with a thickness of approximately 5 μm, for example, is deposited on the front surface of the silicon carbide substrate 10 so as to fill in the contact holes. This aluminum film is then patterned and selectively removed to leave the portion of the aluminum film that covers the source electrode 14 and the interlayer insulating film 13 in the active region remaining as the source pad 15. A portion of the aluminum film may also be left remaining as the gate pad.

Next, using a sputtering process, a titanium (Ti) film, a nickel film, and a gold (Au) film are layered in that order on the surface of the drain electrode 16 to form the drain pad 17. Finally, the semiconductor wafer is diced into individual chips, thus completing the MOSFET illustrated in FIG. 1.

In the embodiment as described above, the width of the third portion of the gate trench being greater than the widths of the first and second portions makes it possible to make the thickness of the gate insulating film substantially uniform over the entire inner wall surface of the gate trench. Moreover, at least the upper corners of the gate trench can be given a smooth shape in which the width of the gate trench increases going from the second portion side towards the opening side (that is, towards the substrate front surface side). This makes it possible to inhibit local concentration of the electric field on the gate insulating film, thereby making it possible to increase the dielectric breakdown field strength of the gate insulating film. This, in turn, makes it possible to improve the reliability of the gate insulating film, thereby making it possible to inhibit deterioration in gate performance over time caused by conduction of current through the MOSFET and to thus improve long-term reliability.

Working Examples

Figures 10, 11:
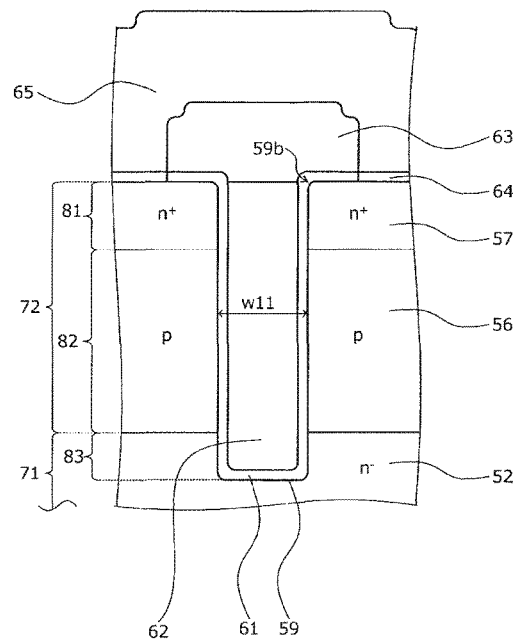
FIG. 10 is a cross-sectional view illustrating the cross-sectional shape of a gate trench in a comparison example.
FIG. 11 is a table showing the dielectric breakdown field strengths of gate insulating films in working examples.

Next, the dielectric breakdown field strength of the gate insulating film 11 was tested. FIG. 10 is a cross-sectional view illustrating the cross-sectional shape of a gate trench in a comparison example. FIG. 11 is a table showing the dielectric breakdown field strengths of gate insulating films in working examples. First, following the method of manufacturing the semiconductor device according to the embodiment described above, a plurality of each of three types of MOSFETs (Working Examples 1 to 3) having different n-type impurity concentration profiles for the n$^+$ source region 7 were respectively manufactured. In all of Working Examples 1 to 3, after the etching process for forming the gate trench 9, a heat treatment was performed for a duration of five minutes at a temperature of 1500° C. in a hydrogen gas atmosphere inevitably containing silane. Then, the gate insulating film 11 was formed on the inner walls of the gate trench 9. The thickness t2 of the n$^+$ source region 7 was set to 0.5 μm.

Working Example 1 has the n-type impurity concentration profile 41a for the n$^+$ source region 7 as well as the tail portion 41b thereof as illustrated in FIG. 2B. More specifically, the n$^+$ source region 7 has an n-type impurity concentration profile 41a in which the impurity concentration was set to a uniform value of 1×10$^{20}$/cm$^3$ going from the interface 30a with the source electrode 14 towards the interface 30b with the p-type base region 6 (that is, over the entire thickness t2 of the n$^+$ source region 7). Moreover, the tail portion 41b is formed in the p-type base region 6 in a continuous manner with the n-type impurity concentration profile 41a. The tail portion 41b has an n-type impurity concentration profile in which the impurity concentration gradually decreases from 1×10$^{20}$/cm$^3$ at a prescribed rate (slope) going deeper from the interface 30b between the n$^+$ source region 7 and the p-type base region 6 towards the substrate rear surface side.

In Working Example 1, due to the n-type impurity concentration profile 41a for the n$^+$ source region 7 as well as the tail portion 41b thereof as illustrated in FIG. 2B, the gate trench 9 was formed with the width w3 of the third portion 33 being greater than the widths w1 and w2 of the portions other than the third portion 33 (that is, the first and second portions 31 and 32). Moreover, the stepped portions 9c that are continuous with the third portion 33 but have a different inclination θ2 than the sidewalls of the third portion 33 were formed in the sidewalls of the second portion 32 of the gate trench 9. In other words, in Working Example 1 the gate trench 9 had the cross-sectional shape illustrated in FIG. 2A. The width w3 of the third portion 33 of the gate trench 9 was approximately 1.0 μm, and the widths w1 and w2 of the first and second portions 31 and 32 were approximately 0.7 μm.

Working Example 2 has the n-type impurity concentration profile 42 illustrated in FIG. 3B for the n$^+$ source region 7. More specifically, in the n$^+$ source region 7, the n-type impurity concentration at the interface 30a with the source electrode 14 was set to 1×10$^{20}$/cm$^3$, and the n-type impurity concentration at the interface 30b with the p-type base region 6 was set to 1×10$^{18}$/cm$^3$. Moreover, the n$^+$ source region 7 has the n-type impurity concentration profile 42 in which the impurity concentration decreases at a prescribed rate and in a substantially linear manner going from the interface 30a with the source electrode 14 towards the interface 30b with the p-type base region 6.

Similar to in Working Example 1, in Working Example 2, due to the n-type impurity concentration profile 42 illustrated in FIG. 3B for the n$^+$ source region 7, the gate trench 9 was formed with the width w3 of the third portion 33 being greater than the widths w1 and w2 of the first and second portions 31 and 32. Moreover, in Working Example 2, the width w3 of the third portion 33 of the gate trench 9 decreased at a prescribed rate and in a substantially linear manner going from the opening side towards the second portion 32 side. In other words, in Working Example 2 the gate trench 9 had the cross-sectional shape illustrated in FIG. 3A. The width w3 of the third portion 33 of the gate trench 9 was approximately 1.0 μm at the widest point on the opening side and was approximately 0.7 μm at the narrowest point at the boundary with the second portion 32. The widths w1 and w2 of the first and second portions 31 and 32 of the gate trench 9 were approximately 0.7 μm.

Working Example 3 has the n-type impurity concentration profile 43 illustrated in FIG. 4B for the n$^+$ source region 7. More specifically, in the n$^+$ source region 7, the n-type impurity concentration at the interface 30a with the source electrode 14 was set to 1×10$^{20}$/cm$^3$, and the n-type impurity concentration at the interface 30b with the p-type base region 6 was set to 1×10$^{18}$/cm$^3$. Moreover, the n$^+$ source region 7 has the n-type impurity concentration profile 43 in which the impurity concentration decreases exponentially going from the interface 30*a* with the source electrode 14 towards the interface 30*b* with the p-type base region 6.

Similar to in Working Example 1, in Working Example 3, due to the n-type impurity concentration profile 43 illustrated in FIG. 4B for the n⁺ source region 7, the gate trench 9 was formed with the width w3 of the third portion 33 being greater than the widths w1 and w2 of the first and second portions 31 and 32. Moreover, in Working Example 3, the width w3 of the third portion 33 of the gate trench 9 decreased gradually going from the opening side towards the second portion 32 side. In other words, in Working Example 3 the gate trench 9 had the cross-sectional shape illustrated in FIG. 4A. The width w3 of the third portion 33 of the gate trench 9 was approximately 0.9 µm at the widest point on the opening side and was approximately 0.7 µm at the narrowest point at the boundary with the second portion 32. The widths w1 and w2 of the first and second portions 31 and 32 of the gate trench 9 were approximately 0.7 µm.

For comparison purposes, another MOSFET (the comparison example) was manufactured in accordance with the method of manufacturing the semiconductor device according to the embodiment described above, except here, after forming a gate trench 59, no heat treatment for rearranging the constituent elements of the silicon carbide was performed before forming a gate insulating film 61. In the comparison example, the gate trench 59 was formed to have sidewalls that were substantially orthogonal to the substrate front surface. In other words, the width w11 of the gate trench 59 was a constant 0.7 µm throughout first to third portions 81 to 83.

Other than the cross-sectional shape of the gate trench 59, the structure of the comparison example was the same as that of Working Example 1. FIG. 10 is a simplified view of the shape of the gate trench 59 in the comparison example. In the comparison example, the shape of the gate trench 59 is not affected by whether first and second p⁺ regions are present. The reference character 71 indicates an n⁻ silicon carbide layer (epitaxial layer) that functions as an n⁻ drift region 52. The reference character 72 indicates a p-type silicon carbide layer, and the portion of the p-type silicon carbide layer 72 other than an n⁺ source region 57 and a p⁺⁺ contact region (not illustrated in the figure) is a p-type base region 56. The reference characters 62, 63, 64, and 65 respectively indicate a gate electrode, an interlayer insulating film, a source electrode, and a source pad.

In Working Examples 1 to 3 and the comparison example, leakage currents (Fowler-Nordheim tunneling currents) created by grounding the source electrode and the drain electrode and then increasing the gate voltage were measured. FIG. 11 shows the average values of the gate voltages at which the leakage current reached $1\times10^{-8}$ A in 100 samples of each of Working Examples 1 to 3 and the comparison example (the "Average Voltage that Yields $1\times10^{-8}$ A" column in FIG. 11). FIG. 11 also shows, for a case in which an electric field of 8 MV/cm was applied to the gate insulating film in the 100 samples of each of Working Examples 1 to 3 and the comparison example, the average values of the drain-source current in samples in which dielectric breakdown did not occur in the gate insulating film (the "Average Current at 8 MV/cm" column in FIG. 11), as well as the numbers of samples in which the device was damaged (that is, in which dielectric breakdown did occur in the gate insulating film; the "Number of Devices Damaged at 8 MV/cm" column in FIG. 11).

The reason the reference value for the leakage current was set to $1\times10^{-8}$ A in the test described above is as follows. In MOSFETs in the 1200V withstand voltage class and above, leakage currents of greater than or equal to $1\times10^{-8}$ A make it difficult to use the MOSFET in real applications. Therefore, the current-carrying capability of the MOSFET when the leakage current is greater than or equal to $1\times10^{-8}$ A can be regarded as being the operational limit of the MOSFET.

Moreover, the reason the reference value for the electric field applied to the gate insulating film was set to 8 MV/cm is as follows. In real MOSFET applications in the 1200V withstand voltage class and above, when the thickness of the gate insulating film is set to 100 nm and a gate voltage of 25V is applied, an electric field of 8 MV/cm is applied to the gate insulating film. Therefore, the gate insulating film must have a dielectric breakdown field strength of at least approximately 8 MV/cm.

As shown in FIG. 11, in Working Examples 1 to 3, the gate voltages at which the leakage current reached $1\times10^{-8}$ A were greater than in the comparison example. Moreover, in Working Examples 1 to 3 the drain-source currents when the electric field of 8 MV/cm was applied to the gate insulating film were less than in the comparison example. Furthermore, in Working Examples 1 to 3 the numbers of samples in which the device was damaged were less than in the comparison example.

In addition, in Working Examples 1 to 3 and the comparison example, samples in which the device was damaged were cut along the location of damage using a focused ion beam (FIB) and then observed under a scanning electron microscope (SEM).

The resulting SEM images suggested that in the samples in which the device was damaged in the comparison example, the dielectric breakdown in the gate insulating film 61 occurred starting from the upper corners 59*b* of the gate trench 59. One possible reason for this is as follows. In the comparison example, the shape of the silicon carbide layer 72 changes sharply (at a substantially right angle) going from the surface of the n⁺ source region 57 (the front surface of the silicon carbide substrate 10) to the sidewalls of the gate trench 59. Therefore, the electric field may potentially be more prone to concentrating at the intersections between the front surface of the silicon carbide substrate 10 and the sidewalls of the gate trench 59 (that is, at the upper corners 59*b* of the gate trench 59).

Meanwhile, in the samples in which the device was damaged in Working Examples 1 to 3, it was observed that the dielectric breakdown in the gate insulating film 11 occurred along the sidewalls and the bottom surface of the gate trench 9. In the samples in which the device was damaged in Working Examples 1 to 3, the dielectric breakdown in the gate insulating film 11 likely occurred at locations where there were formation defects in the gate insulating film 11 caused by issues in the manufacturing process such as introduction of foreign material. In other words, in Working Examples 1 to 3, the dielectric breakdown in the gate insulating film 11 does not occur due to the cross-sectional shape of the gate trench 9, which makes it possible to increase the reliability of the gate insulating film 11 in comparison with the comparison example.

The present invention is not limited to the embodiments described above, and various modifications may be made without departing from the spirit of the present invention. For example, the method of manufacturing according to the embodiment above was described using an example in which the Si plane was selected to be the front surface of the silicon carbide substrate. However, the present invention is not limited to this example, and the surface orientation of the front surface of the silicon carbide substrate may be modified in various ways. Moreover, the embodiments described above are also applicable to wide-bandgap semiconductors other than silicon carbide such as gallium nitride (GaN), for example.

In addition, although the embodiments above were described as being MOSFETs as an example, the present invention is not limited to this example and may be applied to other MOS semiconductor devices such as insulated-gate bipolar transistors (IGBTs), for example. Furthermore, the present invention still exhibits all of the same advantageous effects even if the conductivity types (n-type and p-type) are inverted.

INDUSTRIAL APPLICABILITY

The semiconductor device and the method of manufacturing the semiconductor device according to the present invention as described above are effective in semiconductor devices used in power converters or power supplies for various types of industrial machinery, for example, and are particularly well-suited to use in high withstand voltage semiconductor devices in the 1200V withstand voltage class and above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   a semiconductor substrate made of a semiconductor material having a wider bandgap than silicon;
   a first semiconductor layer of a first conductivity type made of the semiconductor material having a wider bandgap than silicon and formed on a front surface of the semiconductor substrate;
   a second semiconductor layer of a second conductivity type made of the semiconductor material having a wider bandgap than silicon and formed on a surface of the first semiconductor layer on a side opposite to the semiconductor substrate;
   a first semiconductor region of the second conductivity type selectively formed within the first semiconductor layer and contacting the second semiconductor layer;
   a second semiconductor region of the second conductivity type selectively formed within the first semiconductor layer and separated from the second semiconductor layer and the first semiconductor region;
   a third semiconductor region of the first conductivity type selectively formed within the second semiconductor layer adjacent to or in a top surface of the second semiconductor layer;
   a trench going through the third semiconductor region and the second semiconductor layer and reaching the first semiconductor layer, at least a bottom of the trench being in contact with the second semiconductor region in the first semiconductor layer;
   a gate insulating film formed along an inner wall of the trench and having a uniform thickness over an entire surface of the inner wall of the trench;
   a gate electrode formed inside the trench on the gate insulating film;
   a first electrode that is electrically connected to the third semiconductor region and the second semiconductor layer; and
   a second electrode that is electrically connected to a rear surface of the semiconductor substrate,
   wherein the trench has:
      a first portion surrounded by and in contact with the first semiconductor layer;
      a second portion connected to the first portion, surrounded by and in contact with a portion of the second semiconductor layer other than the third semiconductor region; and
      a third portion connected to the second portion, surrounded by and in contact with the third semiconductor region, the third portion being wider than the first portion,
   wherein a depth profile of an impurity concentration in the third semiconductor region is gradually decreasing from a top towards a bottom, or is substantially constant in the third semiconductor region and has a tail portion that extends downwardly from a boundary between the third semiconductor region and said portion of the second semiconductor layer and ends at a prescribed depth from the boundary, and
   wherein sidewalls of the third and second portions of the trench are shaped to correspond to said depth profile of the impurity concentration.

2. The semiconductor device according to claim 1, wherein an impurity concentration of the second semiconductor layer is less than the impurity concentration of the third semiconductor region.

3. The semiconductor device according to claim 1,
   wherein in the trench, a stepped portion that is continuous with a sidewall of the third portion but has a different inclination than the sidewall of the third portion is formed in the sidewall of the second portion, and
   wherein a width of the second portion of the trench at the stepped portion decreases going from the third portion towards the second electrode.

4. The semiconductor device according to claim 1, wherein a width of the third portion of the trench increases going from the second electrode towards the first electrode.

5. The semiconductor device according to claim 1, wherein a sidewall of the third portion of the trench has an arc shape that curves in a convex manner towards an interior of the trench with a radius of curvature of less than a thickness of the third semiconductor region.

6. The semiconductor device according to claim 1, further comprising:
   an interlayer insulating film electrically insulating the gate electrode from the first electrode,
   wherein the gate insulating film extends onto a surface of the second semiconductor layer on a side opposite to the first semiconductor layer,
   wherein the interlayer insulating film covers the gate insulating film and the gate electrode, and
   wherein an interface between the interlayer insulating film and the gate electrode is positioned closer towards the second electrode than an interface between the interlayer insulating film and the gate insulating film.

7. The semiconductor device according to claim 1, wherein the semiconductor material having a wider bandgap than silicon is silicon carbide.

8. A method of manufacturing a semiconductor device, comprising:
   a first step of depositing a first epitaxial layer of a first conductivity type made of a semiconductor material having a wider bandgap than silicon on a front surface of a semiconductor substrate made of the semiconductor material having a wider bandgap than silicon;

a second step of selectively forming a first semiconductor region of a second conductivity type in a surface layer of the first epitaxial layer;

a third step of selectively forming a second semiconductor region of the second conductivity type within the first epitaxial layer;

a fourth step of, after the second step and the third step, depositing a second epitaxial layer of the second conductivity type on the first epitaxial layer;

a fifth step of selectively forming, within the second epitaxial layer, a third semiconductor region of the first conductivity type having a greater impurity concentration than the first epitaxial layer and the second epitaxial layer;

a sixth step of forming a trench going through the third semiconductor region and the second epitaxial layer and reaching the first epitaxial layer, at least a bottom of the trench being in contact with the second semiconductor region in the first epitaxial layer;

a seventh step of etching a sidewall of the trench by performing a heat treatment in an atmosphere containing hydrogen and silane;

an eighth step of forming a gate insulating film along an inner wall of the trench;

a ninth step of forming a gate electrode on the gate insulating film inside the trench;

a tenth step of forming a first electrode that is electrically connected to the third semiconductor region and the second epitaxial layer; and an eleventh step of forming a second electrode that is electrically connected to a rear surface of the semiconductor substrate, wherein the trench has:
- a first portion surrounded by and in contact with the first epitaxial layer;
- a second portion connected to the first portion, surrounded by and in contact with a portion of the second epitaxial layer other than the third semiconductor region; and
- a third portion connected to the second portion, surrounded by and in contact with the third semiconductor region, the third portion being wider than the first portion, wherein a depth profile of an impurity concentration in the third semiconductor region is gradually decreasing from a top towards a bottom, or is substantially constant in the third semiconductor region and has a tail portion that extends downwardly from a boundary between the third semiconductor region and said portion of the second epitaxial layer and ends at a prescribed depth from the boundary, and wherein sidewalls of the third and second portions of the trench are shaped to correspond to said depth profile of the impurity concentration.

9. The method of manufacturing the semiconductor device according to claim 8, wherein in the fifth step, the third semiconductor region is formed such that the impurity concentration thereof decreases going deeper in a thickness direction from a surface of the second epitaxial layer.

10. The method of manufacturing the semiconductor device according to claim 8, wherein in the sixth step, the trench is formed using anisotropic etching.

11. The method of manufacturing the semiconductor device according to claim 8, wherein after the seventh step but before the eighth step, a step that is a group of steps including a twelfth step of forming a sacrificial oxide film by oxidizing the inner wall of the trench and a thirteenth step of removing the sacrificial oxide film formed in the twelfth step to adjust a shape of a sidewall of the trench is performed one or more times.

12. The method of manufacturing the semiconductor device according to claim 8, wherein in the eighth step, the gate insulating film is deposited on the inner wall of the trench.

13. The method of manufacturing the semiconductor device according to claim 8, wherein the semiconductor material having a wider bandgap than silicon is silicon carbide.

14. The method of manufacturing the semiconductor device according to claim 8, wherein the impurity concentration in the third semiconductor region is substantially constant in the third semiconductor region and has the tail portion that extends downwardly from the boundary between the third semiconductor region and said portion of the second semiconductor layer and ends at the prescribed depth from the boundary.

15. The method of manufacturing the semiconductor device according to claim 8, wherein in the seventh step, the sidewall of the trench is etched by performing the heat treatment such that the sidewall of the trench is shaped to generally correspond to a depth profile of the impurity concentration in the third semiconductor region.

\* \* \* \* \*